(12) United States Patent
Campbell et al.

(10) Patent No.: US 8,057,239 B2
(45) Date of Patent: Nov. 15, 2011

(54) POWER MODULE ASSEMBLY

(75) Inventors: Jeremy B. Campbell, Torrance, CA (US); Steve Newson, Redondo Beach, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 311 days.

(21) Appl. No.: 12/432,438

(22) Filed: Apr. 29, 2009

(65) Prior Publication Data

US 2010/0277958 A1    Nov. 4, 2010

(51) Int. Cl.
*H02H 7/04*    (2006.01)
(52) U.S. Cl. .......................................................... 439/40
(58) Field of Classification Search .................... 361/40, 361/39, 111, 119; 363/59–61, 125–127
See application file for complete search history.

(56) References Cited

U.S. PATENT DOCUMENTS

| | | | |
|---|---|---|---|
| 4,169,970 A * | 10/1979 | Opiela et al. ..................... | 369/19 |
| 7,079,379 B2 | 7/2006 | Yamaguchi et al. | |
| 7,085,144 B2 | 8/2006 | Taguchi et al. | |
| 7,443,705 B2 * | 10/2008 | Ito .................................... | 363/61 |
| 7,525,825 B2 | 4/2009 | Korich et al. | |
| 7,728,652 B2 * | 6/2010 | Sohara et al. ................. | 327/536 |
| 2004/0257841 A1 | 12/2004 | Taguchi et al. | |
| 2004/0264220 A1 | 12/2004 | Briere et al. | |
| 2008/0197881 A1* | 8/2008 | Bertin .............................. | 326/63 |
| 2009/0118916 A1* | 5/2009 | Kothari et al. ................... | 701/53 |
| 2010/0014988 A1 | 1/2010 | Tsutsui et al. | |
| 2010/0027305 A1 | 2/2010 | Oyobe et al. | |
| 2010/0204860 A1 | 8/2010 | Mitsutani | |
| 2010/0301975 A1* | 12/2010 | Hammond ..................... | 335/185 |

FOREIGN PATENT DOCUMENTS

| | | |
|---|---|---|
| DE | 602004012949 T2 | 5/2009 |
| EP | 2131481 A1 | 12/2009 |
| JP | 2008154399 A | 7/2008 |
| WO | 2009034882 A1 | 3/2009 |

OTHER PUBLICATIONS

German Office Action dated Jul. 5, 2011 for German Patent Application No. 10 2010 029 461.6.

* cited by examiner

*Primary Examiner* — Jean Duverne
(74) *Attorney, Agent, or Firm* — Ingrassia Fisher & Lorenz, P.C.

(57) ABSTRACT

A power module assembly of the type suitable for deployment in a vehicular power inverter, wherein the power inverter has a grounded chassis, is provided. The power module assembly comprises a conductive base layer electrically coupled to the chassis, an insulating layer disposed on the conductive base layer, a first conductive node disposed on the insulating layer, a second conductive node disposed on the insulating layer, wherein the first and second conductive nodes are electrically isolated from each other. The power module assembly also comprises a first capacitor having a first electrode electrically connected to the conductive base layer, and a second electrode electrically connected to the first conductive node, and further comprises a second capacitor having a first electrode electrically connected to the conductive base layer, and a second electrode electrically connected to the second conductive node.

20 Claims, 5 Drawing Sheets

POWER MODULE ASSEMBLY

STATEMENT REGARDING FEDERALLY SPONSORED RESEARCH OR DEVELOPMENT

This invention was made with Government support under DOE AIETS contract number DE-FC26-07NT43123, awarded by the US-Department of Energy. The Government has certain rights in this invention.

TECHNICAL FIELD

The present invention generally relates to power inverters, and more particularly relates to a power module assembly for a vehicular power inverter.

BACKGROUND OF THE INVENTION

Electric and hybrid electric vehicles often use sources of high voltage such as battery packs or fuel cells that deliver direct current (DC) to drive vehicle motors, electric traction systems (ETS), and other vehicle systems. An ETS is typically under the control of a variable motor drive (VMD) module that generally includes at least one power inverter system designed to convert the DC source input signal to an alternating current (AC) output signal compatible with electric motors and other various electrical components. Such power inverter systems generally include both integrated gate bipolar transistor (IGBT) and capacitor modules interconnected by bipolar busbar and/or cabling assemblies that distribute current throughout the inverter.

The IGBT module generally includes a plurality of individual power modules for converting the DC input signal to an AC output signal. Because accompanying electronic components such as AC and DC cables, busbar assemblies, and other discreet and integrated components such as power diodes and individual IGBTs often have inherent capacitance and/or inductance, such cycling can generate stray AC currents (or "common mode" currents). Common mode currents can produce generally undesirable electromagnetic interference (EMI) radiation that can adversely affect the performance of other nearby radio frequency-based electronic systems such as radio receivers, cellular phones, and the like. Because EMI emissions generally increase with the distance that common mode currents travel from ground to reach their positive or negative busbar source, power inverters on many vehicles include filtering capacitors within a grounded inverter chassis connected between busbars and/or cabling and the chassis that provide such currents with a shortened, low impedance pathway from ground to source.

However, filtering capacitors configured in this manner present several drawbacks. Capacitor filters are located away from the power modules and IGBT devices where many common mode currents originate. As a result, the "loop area" or area circumnavigated by these currents on the ground path may be sufficient to create considerable levels of EMI radiation. This condition is potentially enhanced in vehicles wherein the power inverter chassis and DC source have appreciable separation. Further, achieving a reliable connection between capacitor electrodes and busbar/chassis surfaces can be especially challenging, and often adds significantly to fabrication/assembly cost and complexity.

Accordingly, it is desirable to provide a power module assembly with reduced EMI radiation. Further, it is also desirable if such an assembly is simpler to fabricate. Furthermore, other desirable features and characteristics of the present invention will become apparent from the subsequent detailed description and the appended claims, taken in conjunction with the accompanying drawings and the foregoing technical field and background.

SUMMARY OF THE INVENTION

According to various embodiments, a power module assembly of the type suitable for deployment in a vehicular power inverter, wherein the power inverter has a grounded chassis, is provided. The power module assembly comprises a conductive base layer electrically coupled to the chassis, an insulating layer disposed on the conductive base layer, a first conductive node disposed on the insulating layer, and a second conductive node disposed on the insulating layer, wherein the first and second conductive nodes are electrically isolated from each other. The power module assembly also comprises a first capacitor having a first electrode electrically connected to the conductive base layer, and a second electrode electrically connected to the first conductive node, and further comprises a second capacitor having a first electrode electrically connected to the conductive base layer, and a second electrode electrically connected to the second conductive node.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The various embodiments of the present invention described herein provide assemblies for suppressing EMI radiation by filtering common mode currents from a vehicular power inverter system. These assemblies, which include at least one pair of capacitors, may be integrated within either a power module within the power inverter, or may be integrated into a DC source assembly disposed in any convenient location within the vehicle. A power module-based integration includes a first capacitor connected between ground and positive DC nodes of a power module, and a second capacitor connected between ground and negative DC nodes of the power module. A DC source integration includes a first capacitor coupled between vehicle ground and a positive DC source pole (or terminal), and a second capacitor coupled between ground and a negative DC source terminal. In either configuration, the capacitors provide a low impedance pathway from ground for common mode currents nearer to the source thereof, decreasing current loop area and suppressing EMI radiation thereby.

Figure 1:
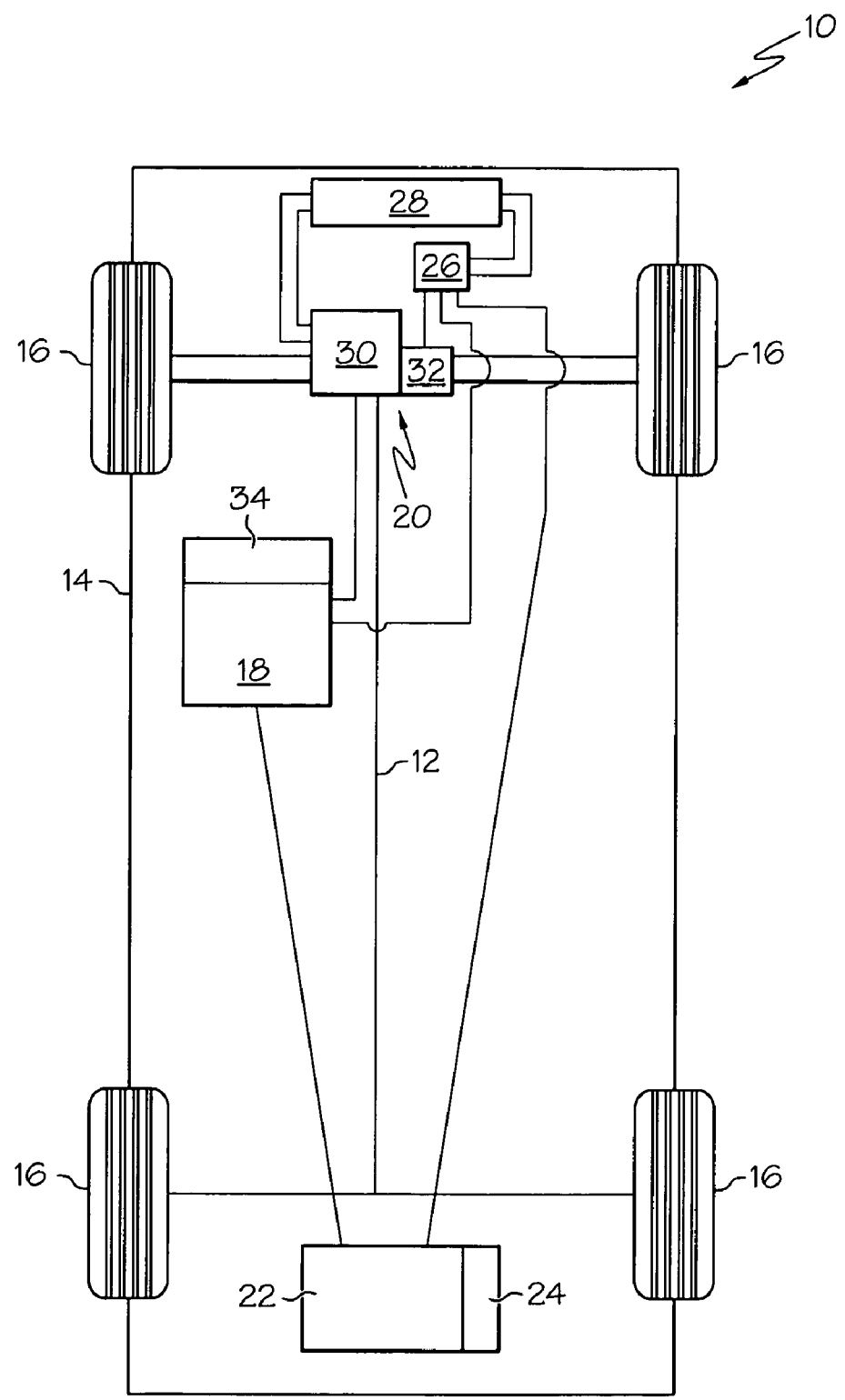
FIG. 1 is a schematic diagram of an exemplary vehicle illustrating the manner in which a power inverter and a DC source are integrated with various sub-components of the vehicle in accordance with an exemplary embodiment.

FIG. 1 is a schematic diagram of an exemplary vehicle 10 in accordance with an exemplary embodiment of the present invention. Vehicle 10 includes a chassis 12, a body 14, four wheels 16, and an electronic control system (or electronic control unit (ECU)) 18. The body 14 is arranged on the chassis 12 and substantially encloses the other components of vehicle 10. The body 14 and the chassis 12 may jointly form a frame. The wheels 16 are each rotationally coupled to the chassis 12 near a respective corner of body 14.

Vehicle 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). Vehicle 10 may also incorporate any one of, or combination of, a number of different types of engines (or actuators), such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, or a fuel cell, a combustion/ electric motor hybrid engine, and an electric motor.

In the exemplary embodiment illustrated in FIG. 1, vehicle 10 is a hybrid vehicle that further includes an actuator assembly (or powertrain) 20, a battery (or DC source) assembly 22, a battery state of charge (SOC) system 24, a power inverter assembly 26, and a radiator 28. Battery assembly 22 may be located within any suitable region of vehicle 10, such as, for example, in the rear of the vehicle, and is electrically coupled to various electrical components including power inverter assembly 26 using cabling and/or busbars. Actuator assembly 20 suitably includes an internal combustion engine 30 and an electric motor/generator (or motor) system (or assembly) 32. In one embodiment, battery assembly 22 includes a lithium ion (Li-ion) battery including any number of cells, as is commonly used. ECU 18 may also include a variable motor drive module 34 configured to control various vehicular functions including but not limited to electric motor torque and speed.

Power inverter assembly 26 includes capacitor and IGBT modules (not shown) as well as other conductive elements configured to provide a pathway for current flow between these and other associated electronic components such as DC source assembly 22. These conductive elements may include one or more busbars used in conjunction with conductive cabling. Such busbar assemblies may be configured as desired to compactly fit between capacitor and IGBT module assemblies and to shorten the current pathway between these components to minimize the overall system inductance.

Figure 2:
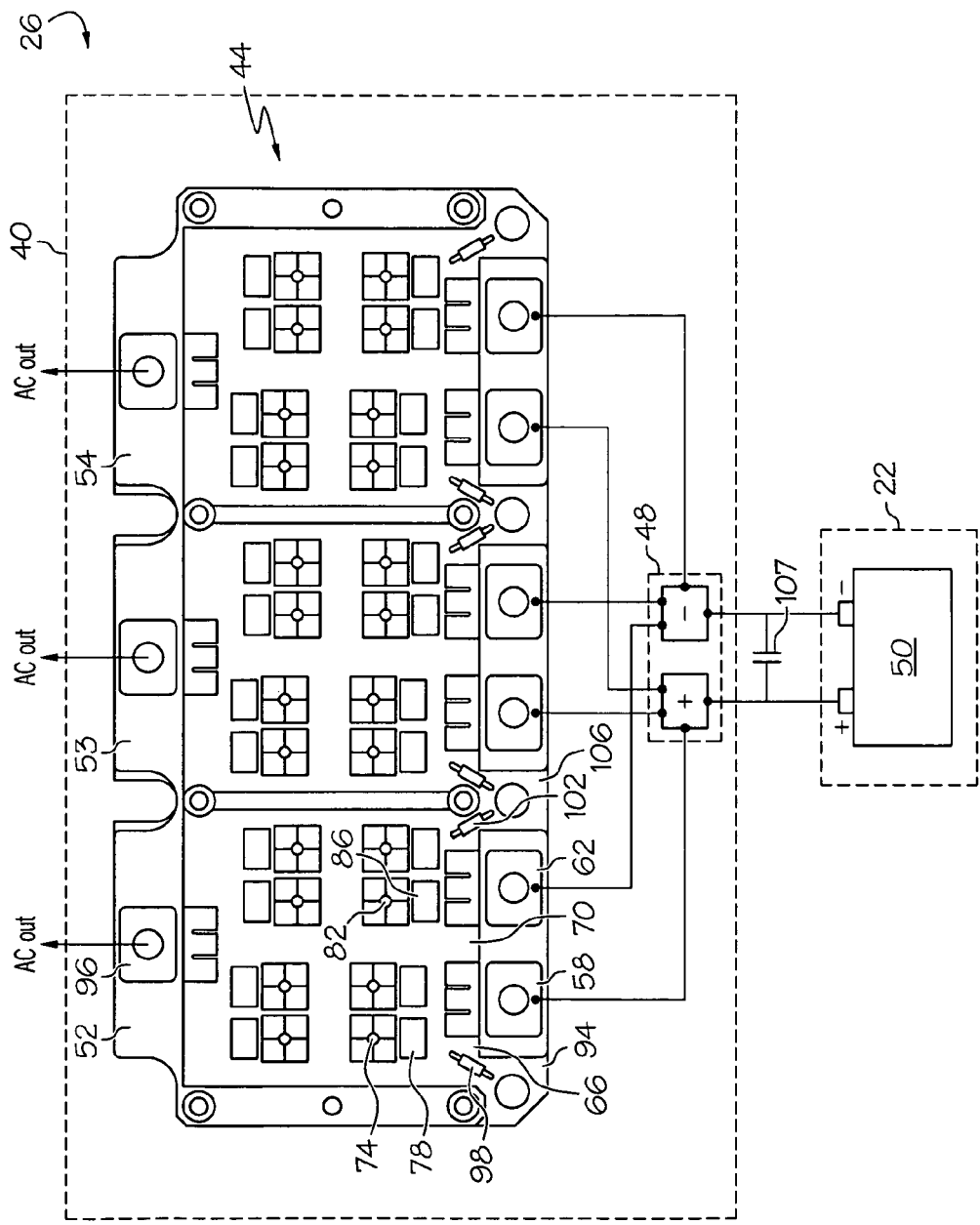
FIG. 2 is a schematic diagram of the power inverter depicted in FIG. 1 having power module assemblies in accordance with an exemplary embodiment.
Figure 3:
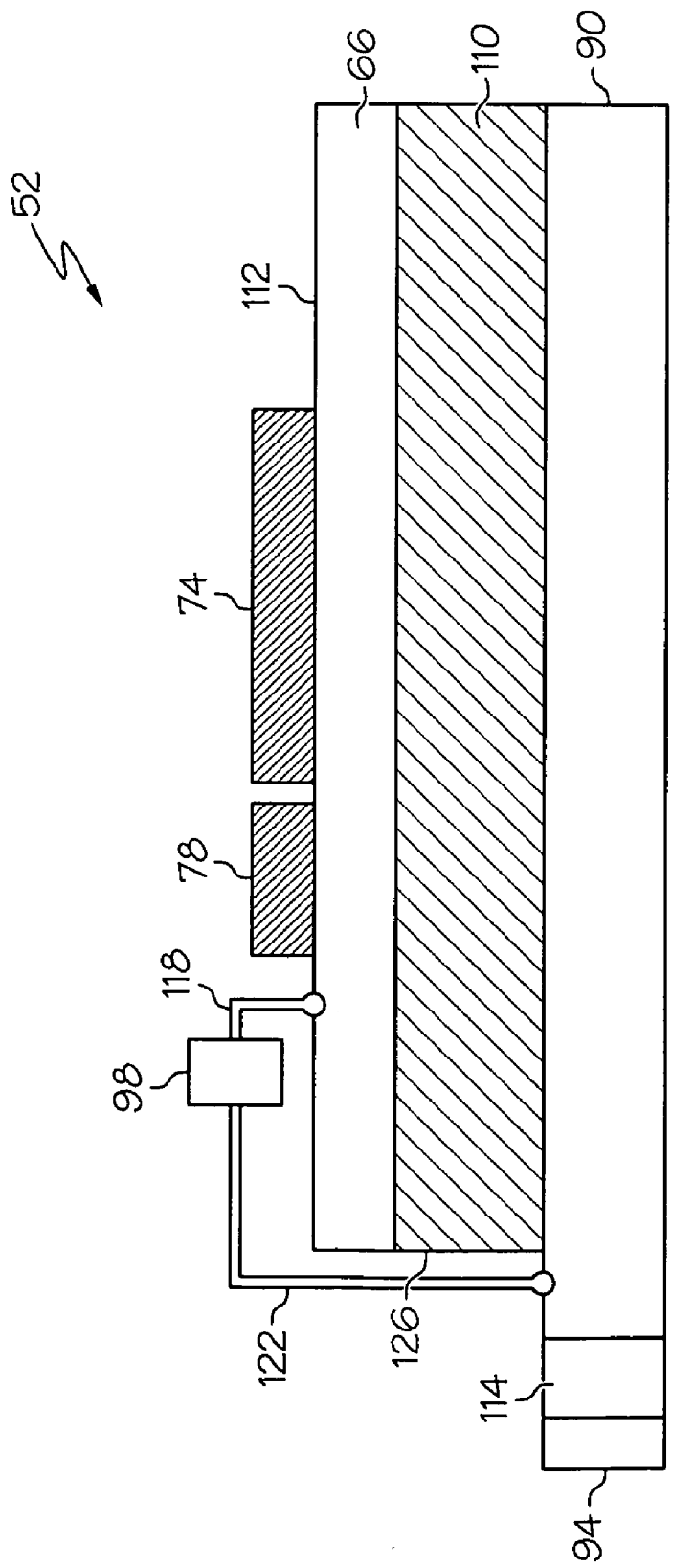
FIG. 3 is a cross-sectional view of an exemplary power module assembly of the type depicted in FIG. 2, illustrating a manner in which a filtering capacitor is integrated therein, in accordance with an exemplary embodiment.

FIG. 2 is a schematic diagram illustrating selected components of power inverter assembly 26 including power modules for use in vehicle 10 (FIG. 1) in accordance with a first exemplary embodiment. FIG. 3 is a cross-sectional schematic view of an exemplary power module of the type depicted in FIG. 2, illustrating a manner in which a filtering capacitor is integrated therein, in accordance with an exemplary embodiment. Referring to FIG. 2, power inverter assembly 26 includes a housing (or chassis) 40, an IGBT module 44, and a suitable current distributing device such as a busbar 48. Chassis 40 provides enclosed environmental protection for the electronic components contained within power inverter assembly 26. Chassis 40 may itself be fabricated of a conductive material and grounded to the vehicle chassis 12 (FIG. 1) to provide a ground source for housed electrical components, or may contain one or more grounded conductive members suitable for this purpose. IGBT module 44 may contain any number of individual power modules, and in the example illustrated in FIG. 2, contains three such power modules 52-54. Busbar 48 is configured in a conventional manner to receive a bipolar DC input signal from a battery 50 within DC source assembly 22 (FIG. 1), and to distribute positive and negative DC signals to corresponding input nodes of each of modules 52-54.

Because modules 52-54 are similar in both function and configuration, for the sake of brevity, only first module 52 will be described in detail. First module 52 includes positive and negative DC input nodes 58 and 62, respectively, each electrically coupled through busbar 48 to the positive and negative terminals of battery 50. First module 52 includes first and second conductive layers 66 and 70 at an outer surface thereof, these layers electrically isolated from each other and electrically coupled to positive and negative DC input nodes 58 and 62, respectively. Conductive layers 66 and 70 may be made from any suitable conductive material such as, for example, copper or an alloy thereof. Conductive layers 66 and 70 may each have any number of power devices including at least one individual IGBT and one power diode electrically connected thereto. For example, first conductive layer 66 has a first IGBT 74 and a first power diode 78, and second conductive layer 70 has a second IGBT 82 and a second power diode 86. Referring to FIG. 3, first power module 52 also has a grounded base conductive layer 90 electrically isolated from first and second conductive layers 66 and 70 by an interposed insulating layer 110. In one embodiment, base conductive layer 90 includes at least one grounding tab 94 configured for convenient mechanical coupling and electrical grounding within chassis 40. First module 52 also includes an AC output node 96 configured to transfer a single-phase AC output signal from module 52 to a suitable AC system.

First power module 52 includes a first capacitor 98 having a first electrode 118 electrically connected to first conductive layer 66, and a second electrode 122 in electrical communication with ground (grounded) via electrical connection to base conductive layer 90. In one embodiment, second electrode 122 is grounded by electrical connection to tab 94. Referring again to FIG. 2, first module 52 also includes a second capacitor 102 having two electrodes; the first in electrical communication with negative DC input node 62 via connection to second conductive layer 70, and the second electrode electrically connected to base conductive layer 90 (FIG. 3). The ground connection may be done in a manner previously described with respect to first capacitor 98, through electrically connection to a second tab 106 (as shown). Second and third power modules 53 and 54 may also include a capacitor pairing similar to capacitors 98 and 102, with individual capacitors connected between positive and negative nodes of each module and ground. A balancing capacitor 107 having a suitable capacitance may be coupled between positive and negative DC source conductors in any suitable location and manner, such as, for example, in cabling from DC source assembly 22. Balancing capacitor 107 enhances the performance of the overall system by suppressing voltage oscillations between the positive DC and/or negative DC.

First and second capacitors 98 and 102 may have any suitable capacitance rating that may depend upon factors that include the switching frequency of the associated IGBTs. In one embodiment, capacitors 98 and 102 have a capacitance of from about 100 picofarads (pF) to about 1 microfarad (μF). In another embodiment, capacitors 98 and 102 have a capacitance of from about 100 nanofarads (nF) to about 0.5 microfarad (μF).

During operation, DC source assembly 22 provides a DC input signal that is distributed by busbar 48 to positive and negative DC input nodes 58 and 62, respectively. The DC signal is transformed by the power devices and other associated electronic components of module 52 into a switchable, single-phase AC signal transferred through output node 96. First and second capacitors 98 and 102 provide a low impedance pathway from ground to positive and negative power module input nodes for common mode currents generated by such voltage cycling. The direct connection of capacitors to the power module input nodes reduces the loop area for such common mode currents, suppressing EMI radiation accordingly.

Referring again to FIG. 3, power module 52 includes base conductive layer 90, first conductive layer 66, and an insulating layer 110 interposed therebetween. The conducting layers are conventionally bonded to opposing faces of insulating layer 110. Conductive layers 66 and 90 may be made from a suitable conductive material such as, for example, copper or an alloy thereof. Insulating layer 110 may be made from a suitably sturdy and electrically insulating layer such as, for example, an epoxy of the type commonly used for circuit board substrates. First IGBT 74 and first power diode 78 are each electrically connected to an outer surface 112 of first conductive layer 66 in a conventional manner such as by soldering. In one embodiment, base conductive layer 90 includes tab 94 coupled thereto. In another embodiment, tab 94 is integrally formed with base conductive layer 90. As used herein, the term "integrally joined" or "integrally formed" means that a first element, (such as tab 94) extends or transitions in a continuous manner from a second element (such as base conductive layer 90), and not as two separate elements having a clearly distinguishable boundary. Accordingly, in this embodiment, tab 94 is an extension of, and thus is an integral part of, base conductive layer 90. Tab 94 has an opening 114 configured for convenient connection to a grounded structure within chassis 40 (FIG. 2) using a suitable fastener (not shown). First capacitor 98 includes first electrode 118 electrically connected to first conductive layer 66, and second electrode 122 electrically connected to base conductive layer 90. Connection of capacitor electrodes to conductive layers may be done in a conventional manner such as by soldering. Second electrode 122 is configured so as not to contact, and thus electrically short with, first conductive layer 66. In one embodiment, insulating layer 110 has a side surface 126, and second electrode 122 is connected to base conductive layer 90 across side surface 126. In another embodiment, second electrode 122 is connected to tab 94. While FIG. 3 illustrates first capacitor 98 connected between first conductive layer 66 and base conductive layer 90 across side surface 126, is should be appreciated that second capacitor 102 (FIG. 2) may also be similarly connected across side surface 126 between second conductive layer 70 and base conductive layer 90.

During operation, DC signals are transferred to first and second conductive layers 66 and 70 (FIG. 2) in a manner previously described, and are transformed into a single-phase AC output signal using power devices including first IGBT 74 and first power diode 78. First capacitor 98 provides a low impedance grounded pathway from first conductive layer 66 to base conductive layer 90 for common mode currents generated when such output signals are cycled on and off. Because these currents are shunted from a more circuitous and lengthy pathway to ground, the amount of associated EMI radiation generated is significantly reduced.

Figure 4:
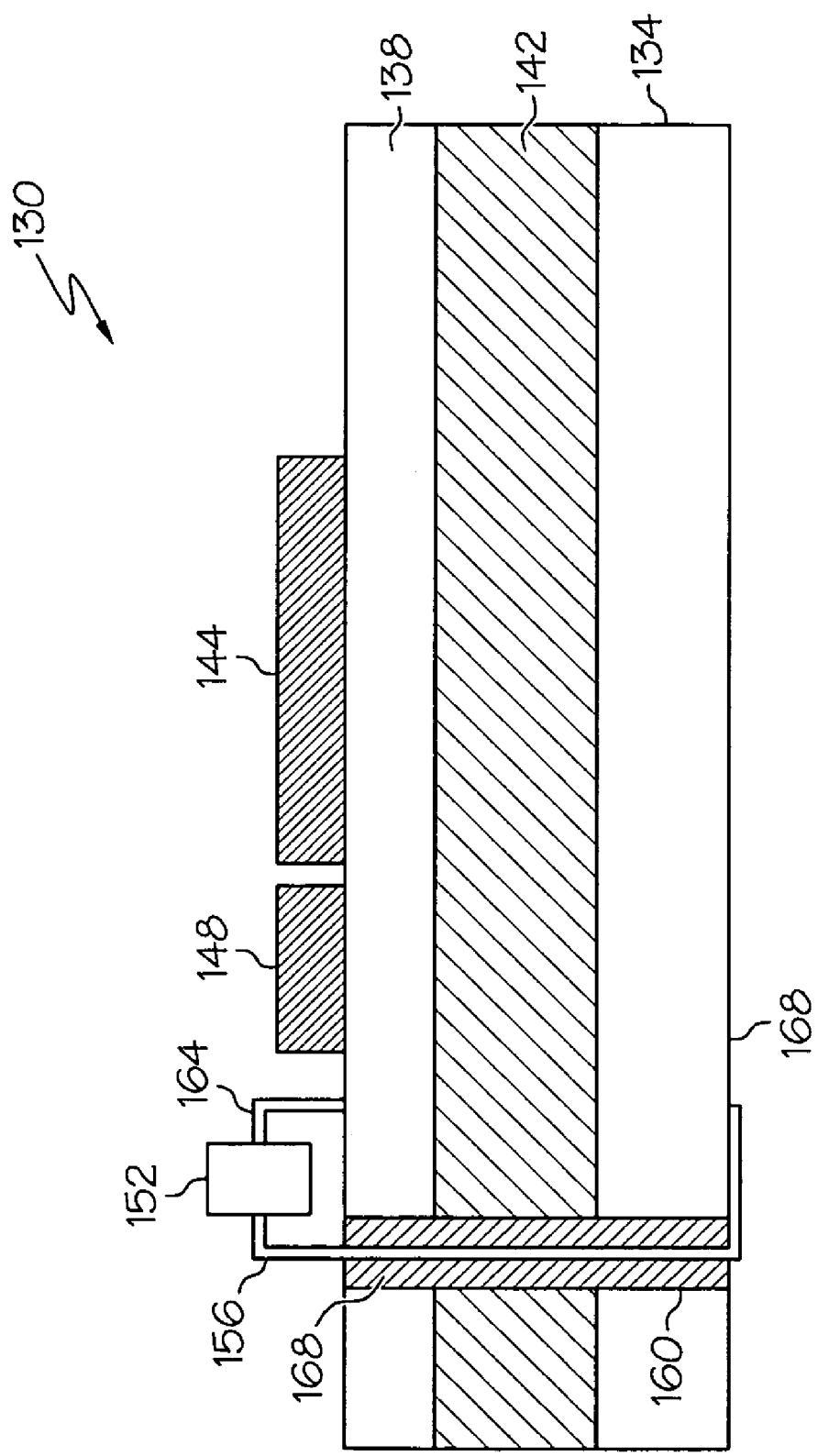
FIG. 4 is a cross-sectional view of an exemplary power module of the type depicted in FIG. 2, illustrating a manner in which a filtering capacitor is integrated therein, in accordance with another exemplary embodiment.

FIG. 4 is a cross-sectional view of a power module 130, in accordance with another exemplary embodiment. Power module 130 includes a base conductive layer 134, a first conductive layer 138, an insulating layer 142, an IGBT 144, and a power diode 148, these elements arranged in a manner similar to like elements previously described with reference power module 52, and illustrated in FIG. 3. First conductive layer 138 may be coupled to either the positive or negative DC input source nodes. A capacitor 152 has a first electrode 156 connected with base conductive layer 134 through an opening 160 perforating through conductive layers 134 and 138, and insulating layer 142. Capacitor 152 has a second electrode 164 electrically connected to first conductive layer 138. In one embodiment, opening 160 has a non-conducting sleeve 168 that lines the inner surface thereof preventing first electrode 156 from shorting with first conductive layer 138. Sleeve 168 may be any suitable insulating material such as a ceramic, and ideally has a thermal coefficient of expansion similar to that of the material chosen for conductive layers 134 and 138.

During operation, common mode currents may be generated by devices associated with power module 130, as previously described. Capacitor 152 provides a low impedance pathway for such currents between first conductive layer 138 and ground, and between base conductive layer 134 and ground, reducing associated EMI radiation thereby.

Figure 5:
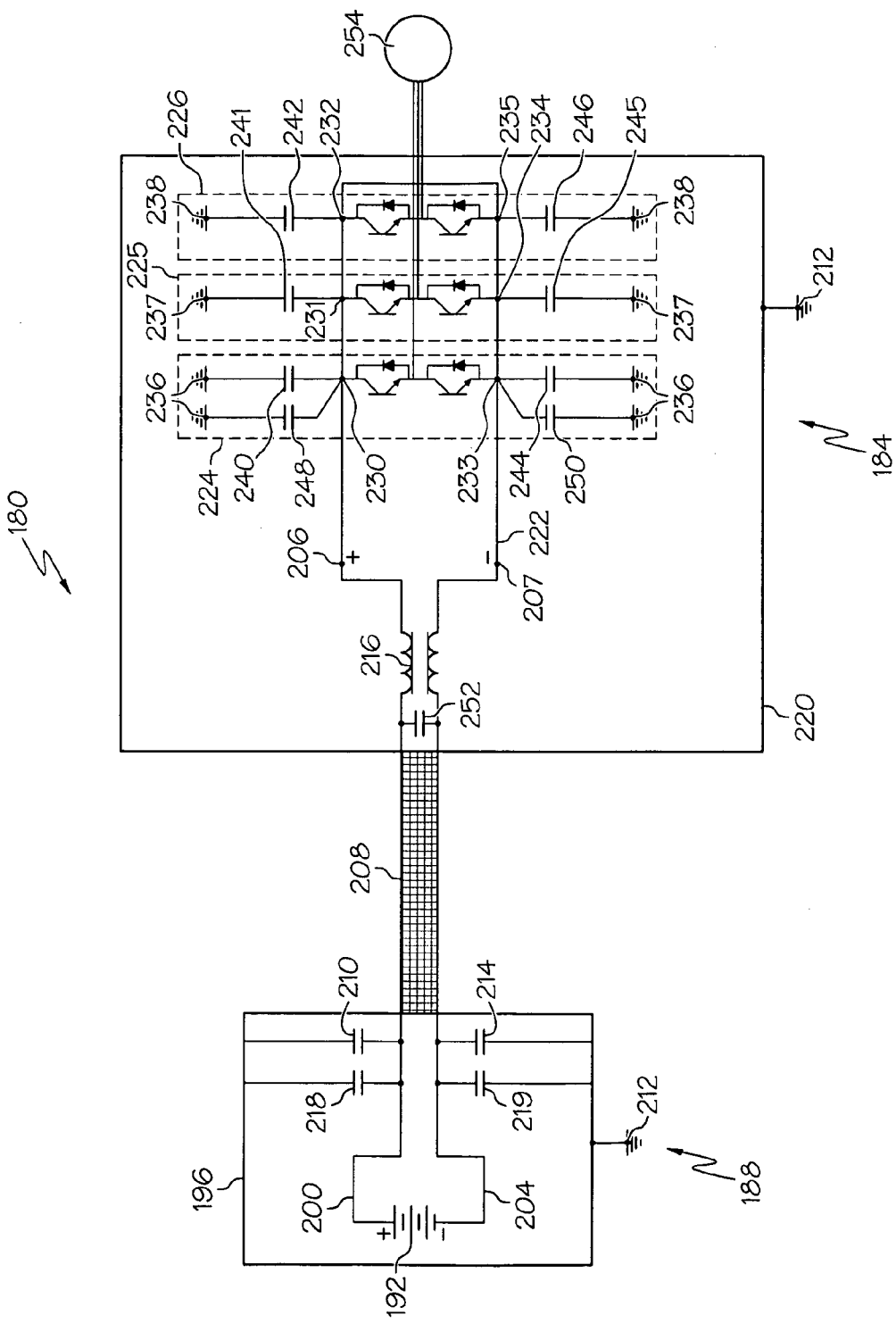
FIG. 5 is a schematic diagram of a vehicular power inverter system including power inverter and DC source assemblies of the type deployable in the vehicle depicted in FIG. 1, and having filtering capacitors in accordance with a further exemplary embodiment.

FIG. 5 is a schematic diagram depicting selected elements of a power inverter system 180 including a power inverter 184 electrically coupled to a DC battery assembly 188, in accordance with another exemplary embodiment. DC battery assembly 188 includes a housing (or chassis) 196 and a DC battery 192 disposed therein, having positive and negative terminals 200 and 204, respectively, coupled to positive and negative DC input nodes 206 and 207, respectively, within power inverter 184. Housing 196 may be made of any suitable material including a conductive material grounded to a vehicle ground 212, and useful as a grounding source for electrical components housed therein. Housing 196 may also contain at least one grounded conductive member in electrical communication with ground 212 suitable for this purpose if housing 196 is not made from a conducting material. Electrical coupling between DC battery assembly 188 and power inverter 184 includes a bipolar cable assembly 208 that may include suitable shielding. Those of skill in the art will appreciate that DC battery assembly 188 may be disposed at any suitable distance from power inverter 184 including at substantially opposite ends of the vehicle, and may contain additional components for electrically coupling DC battery 192 to inverter 184 such as, for example, one or more busbars.

DC battery assembly 188 includes a first capacitor 210 disposed within housing 196 having a first electrode coupled to positive terminal 200, and having a second electrode coupled to vehicle ground 212. Assembly 188 also includes a second capacitor 214 disposed within housing 196 having a first electrode coupled to negative terminal 204, and having a second electrode coupled to ground 212. Coupling of capacitor electrodes to battery terminals may be done conventionally via coupling to cable assembly 208 or to a busbar (not shown) if one is used. In another embodiment, a second pairing of capacitors is coupled between each of battery terminals 200 and 204 and ground 212 parallel to first and second capacitors 210 and 214. That is, a third capacitor 218 has a first electrode coupled to positive terminal 200, and a second electrode coupled to vehicle ground 212. A fourth capacitor 219 is similarly coupled between negative terminal 204 and ground 212.

Power inverter 184 includes an IGBT module 222 which may have any number of individual power modules, and a busbar 216, each housed within a chassis 220 that is electrically coupled to vehicle ground 212. In the example depicted in FIG. 5, IGBT module 222 includes three power modules 224-226, each power module having a positive DC input node coupled to positive DC input node 206, a negative DC input node coupled to negative DC input node 207, and a ground node coupled to vehicle ground 212. For example, power module positive DC input nodes 230-232 are each electrically coupled to positive DC input node 206, power module negative DC input nodes 233-235 are each electrically coupled to negative DC input node 207, and power module grounding nodes 236-238 are each electrically coupled to vehicle ground 212. The positive and negative input nodes of each power module each include at least one IGBT/power diode pair, as is commonly used. Each power module DC input node includes a capacitor electrically connected between that node and a ground node on the base of each power module. For example, capacitors 240-242 each have first electrodes connected to positive DC input nodes 230-232, respectively, and each have second electrodes connected to ground nodes 236-238, respectively. Similarly, capacitors 244-246 each have first electrodes connected to negative DC input nodes 233-235, respectively, and each have second electrodes connected to ground nodes 236-238, respectively.

In another embodiment, first power module 224 has a second pair of capacitors connected in parallel to capacitors 240 and 244. Such a configuration may be used to reduce the internal resistances and inductances of the capacitors, thereby further reducing EMI radiation. That is, a first parallel capacitor 248 has a first electrode connected to positive DC input node 230, and has a second electrode connected to ground node 236, and is thus connected in parallel to first capacitor 240. Similarly, a second parallel capacitor 250 has a first electrode connected to negative DC input node 233, and has a second electrode connected to ground node 236, and is thus connected in parallel to second capacitor 244. While one electrode from each capacitor described above is described as being connected to a ground node, it is understood that these grounded electrodes are connected to the base conducting layer on the associated power module, or to a grounding tab electrically coupled to this base conducting layer as previously described and illustrated, for example, in FIG. 3. For reasons previously discussed with reference to balancing capacitor 107, a suitable balancing capacitor 252 may be coupled between positive and negative DC source conductors such as, for example, between positive and negative lines of cable assembly 208 (as shown) or between positive and negative nodes of busbar 216.

During operation, DC battery 192 provides DC input signals conducted through cable assembly 208 to busbar 216. Busbar 216 distributes this DC signal to positive and negative DC input nodes 230-232 and 233-235, respectively, of power modules 224-226. These power modules each provide a single-phase AC output signal directed toward a suitable AC system such as to a motor 254. Common mode currents generated by power modules are shunted to ground from positive power input module nodes by capacitors 240-242 (and capacitor 248 if used), and to ground from negative power module input nodes by capacitors 244-246 (and capacitor 250 if used). Similarly, common mode currents generated within DC battery assembly 188 are shunted to ground from positive DC cables/nodes by capacitor 210 (and capacitor 218 if used), and from negative DC cables/nodes by capacitor 214 (and capacitor 219 if used). Additional capacitor pairings may be connected in parallel to first capacitor pairings as needed for DC battery assembly 188 and/or any of power modules 224-226.

Accordingly, the various embodiments of the present invention described herein provide power module and DC source assemblies of the type suitable for integration into a vehicular power inverter system, having reduced EMI radiation. Power modules include a first capacitor directly connected between a module ground node and the positive DC module input node, and a second capacitor connected between the module ground node and a negative DC module input node. Such an integration into the power module alleviates the need to connect capacitors to other power inverter components such as to cabling or busbar assemblies, thus simplifying the assembly of IGBT modules. This integration also reduces the need for additional, larger capacitors housed within the inverter chassis and thus is more spatially efficient and lightweight. DC source assemblies include a first capacitor coupled between vehicle ground and the positive DC source terminal, and a second capacitor coupled between ground and the negative DC source terminal. By integrating capacitors nearer the source of common mode currents in either the DC source assemblies or the power modules, the current loop area is significantly decreased and, accordingly, associated EMI radiation is also commensurately reduced. Further, when used externally to an inverter chassis and within a DC source assembly, capacitors are kept away heat sources and elevated temperatures thereby. For either application, additional capacitors may be added in parallel with the first set of capacitors to achieve enhanced overall performance. While certain of the preceding embodiments have been described in the context of use in a power inverter assembly, it is understood that this invention may be applied to other systems which include IGBT modules such as, for example, motor drives, AC-to-AC converters, AC-to-DC converters, and the like.

The preceding description refers to elements or nodes or features being "connected" or "coupled" together. As used herein, unless expressly stated otherwise, "connected" means that one element/node/feature is directly joined to (or directly communicates with) another element, node or other feature in a mechanical, logical, electrical or other appropriate sense. Likewise, unless expressly stated otherwise, "coupled" means that one element/node/feature is directly or indirectly joined to (or directly or indirectly communicates with) another element/node/feature in a mechanical, logical, electrical or other appropriate sense. The term "exemplary" is used in the sense of "example," rather than "model." Further, although the figures may depict example arrangements of elements, additional intervening elements, devices, features, or components may be present in a practical embodiment of the invention. Furthermore, while in the preceding description, certain elements may be accompanied by descriptors such as "first" and "second," etc., it should be understood that the following claims may contain such descriptors used in a different manner consistent with the order in which these elements are introduced within the claims.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A power module assembly of a type suitable for deployment in a vehicular power inverter, the power inverter having a grounded chassis, the power module assembly comprising:
   a conductive base layer electrically coupled to the chassis;
   an insulating layer disposed on the conductive base layer;
   a first conductive node disposed on the insulating layer;
   a second conductive node disposed on the insulating layer, the first and second conductive nodes electrically isolated from each other;
   a first capacitor having a first electrode electrically connected to the conductive base layer, and having a second electrode electrically connected to the first conductive node; and
   a second capacitor having a first electrode electrically connected to the conductive base layer, and having a second electrode electrically connected to the second conductive node.

2. An assembly according to claim 1, further comprising a third capacitor having a first electrode electrically connected to the conductive base layer, and having a second electrode connected to the first conductive node.

3. An assembly according to claim 2, further comprising a fourth capacitor having a first electrode electrically connected to the conductive base layer, and having a second electrode electrically connected to the second conductive node.

4. An assembly according to claim 1, wherein the insulating layer further comprises an opening therethrough, and wherein the first electrode of the first capacitor and the conductive base layer are electrically connected together through the opening.

5. An assembly according to claim 4, further comprising an electrically insulating sleeve in the opening, the sleeve configured to electrically insulate the first electrode of the first capacitor from the first conductive node.

6. An assembly according to claim 1, wherein the insulating layer further comprises a side surface, and wherein the first electrode of the first capacitor and the conductive base layer are electrically connected together across the side surface.

7. An assembly according to claim 1, wherein the first capacitor has a capacitance of from about 100 pF to about 1 µF.

8. An assembly according to claim 7, wherein the first capacitor has a capacitance of from about 100 nF to about 0.5 µF.

9. A power inverter assembly suitable for deployment in a vehicle and configured to be electrically coupled to a DC source having a first terminal and a second terminal, the assembly having a grounded chassis, the assembly comprising:
   a power module comprising:
      a first conductive layer electrically coupled to the chassis;
      an electrically insulating layer disposed on the first conductive layer;
      a second conductive layer disposed on the electrically insulating layer and electrically coupled to the first terminal of the DC source; and
      a third conductive layer disposed on the electrically insulating layer and electrically coupled to the second terminal of the DC source, the second and third conductive layers electrically isolated from each other;
   a first capacitor having a first electrode electrically connected to the first conductive layer, and having a second electrode electrically connected to the second conductive layer; and
   a second capacitor having a first electrode electrically connected to the first conductive layer, and having a second electrode electrically connected to the third conductive layer.

10. An assembly according to claim 9, further comprising a third capacitor having a first electrode electrically connected to the first conductive layer, and having a second electrode electrically connected to the second conductive layer.

11. An assembly according to claim 10, further comprising a fourth capacitor having a first electrode electrically connected to the first conductive layer, and having a second electrode electrically connected to the third conductive layer.

12. An assembly according to claim 9, wherein the electrically insulating layer further comprises an opening therethrough, and wherein the first terminal of the first capacitor is connected to the first conductive layer through the opening.

13. An assembly according to claim 9, wherein the electrically insulating layer has a side surface, and wherein the first terminal of the first capacitor is connected to the first conductive layer across the side surface.

14. A power inverter system suitable for deployment in a vehicle, the vehicle having an electrically grounded frame, the assembly comprising:
   a DC source assembly comprising:
      a housing disposed within the vehicle, and comprising a conductive member electrically coupled to the frame;
      a DC source disposed within the housing, and having a first terminal and a second terminal;
      a first capacitor disposed within the housing and having a first electrode electrically coupled to the conductive member, and having a second electrode electrically coupled to the first terminal; and
      a second capacitor disposed within the housing and having a first electrode electrically coupled to the conductive member, and having a second electrode electrically coupled to the second terminal.

15. An assembly according to claim 14, further comprising:
   a third capacitor disposed within the housing and having a first electrode electrically coupled to the conductive member, and having a second electrode electrically coupled to the first terminal; and
   a fourth capacitor disposed within the housing and having a first electrode electrically coupled to the conductive member, and having a second electrode electrically coupled to the second terminal.

16. An assembly according to claim 14, further comprising a power inverter having a chassis electrically coupled to the frame, and having a power module disposed within the chassis, the power module comprising:
   a first conductive layer electrically coupled to the chassis;
   an electrically insulating layer disposed on the first conductive layer;
   a second conductive layer disposed on the electrically insulating layer, and electrically coupled to the first terminal of the DC source;
   a third conductive layer disposed on the electrically insulating layer and electrically coupled to the second terminal of the DC source, the second and third conductive layers electrically isolated from each other;

a third capacitor having a first electrode electrically connected to the first conductive layer, and having a second electrode electrically connected to the second conductive layer; and a fourth capacitor having a first electrode electrically connected to the first conductive layer, and having a second electrode electrically connected to the third conductive layer.

17. An assembly according to claim 16, further comprising:

a fifth capacitor having a first electrode electrically connected to the first conductive layer, and having a second electrode electrically connected to the second conductive layer; and a sixth capacitor having a first electrode electrically connected to the first conductive layer, and having a second electrode electrically connected to the third conductive layer.

18. An assembly according to claim 17, further comprising:

a seventh capacitor disposed within the housing and having a first electrode electrically coupled to the conductive member, and having a second electrode electrically coupled to the first terminal; and an eighth capacitor disposed within the housing and having a first electrode electrically coupled to the conductive member, and having a second electrode electrically coupled to the second terminal.

19. An assembly according to claim 16, wherein the electrically insulating layer further comprises a side surface, and wherein the first electrode of the third capacitor is electrically connected to the first conductive layer across the side surface.

20. An assembly according to claim 16, wherein the electrically insulating layer further comprises an opening therethrough, and wherein the first electrode of the third capacitor is electrically connected to the first conductive layer through the opening.

* * * * *